(12) United States Patent
Chapman et al.

(10) Patent No.: US 11,960,339 B2
(45) Date of Patent: Apr. 16, 2024

(54) MULTI-DIE STACKED POWER DELIVERY

(71) Applicant: ADVANCED MICRO DEVICES, INC., Santa Clara, CA (US)

(72) Inventors: Eric J. Chapman, Austin, TX (US); Alan D. Smith, Austin, TX (US); Edward Chang, FT. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/371,459

(22) Filed: Jul. 9, 2021

(65) Prior Publication Data

US 2023/0009881 A1      Jan. 12, 2023

(51) Int. Cl.
*G06F 1/28* (2006.01)
*H01L 25/18* (2023.01)

(52) U.S. Cl.
CPC ............... *G06F 1/28* (2013.01); *H01L 25/18* (2013.01)

(58) Field of Classification Search
CPC .................................. G06F 1/28; H01L 25/18
See application file for complete search history.

(56) References Cited

U.S. PATENT DOCUMENTS

| | | | |
|---|---|---|---|
| 11,435,802 B2 * | 9/2022 | Savidis | G06F 9/5083 |
| 2007/0050650 A1 * | 3/2007 | Conroy | G06F 1/26 713/300 |
| 2007/0250721 A1 | 10/2007 | Searles et al. | |
| 2008/0111534 A1 * | 5/2008 | Ravichandran | G06F 1/32 323/349 |
| 2010/0042858 A1 | 2/2010 | Padhye et al. | |
| 2013/0283026 A1 * | 10/2013 | Wells | G06F 1/26 713/1 |
| 2015/0153393 A1 | 6/2015 | Jeon | |
| 2018/0102251 A1 * | 4/2018 | Delacruz | H01L 21/2007 |
| 2018/0316180 A1 * | 11/2018 | Batenburg | H02H 3/20 |
| 2019/0018815 A1 * | 1/2019 | Fleming | G06F 9/5027 |
| 2019/0206450 A1 * | 7/2019 | Contreras | H01L 24/02 |
| 2019/0259743 A1 * | 8/2019 | Han | H01L 25/0657 |
| 2019/0332153 A1 * | 10/2019 | Zhang | G06F 1/28 |
| 2020/0106478 A1 * | 4/2020 | Contreras | H01L 25/0657 |
| 2020/0251448 A1 * | 8/2020 | Choi | H01L 25/18 |
| 2020/0373286 A1 | 11/2020 | Dennis et al. | |
| 2020/0411476 A1 * | 12/2020 | Chen | H01L 24/33 |
| 2021/0043574 A1 * | 2/2021 | Templeton | H01L 23/50 |

(Continued)

FOREIGN PATENT DOCUMENTS

WO      2020-243626      12/2020

OTHER PUBLICATIONS

NPL Wikipedia, 2021 (Year: 2021).*

(Continued)

*Primary Examiner* — Aurel Prifti (57) ABSTRACT

A multi-die processor semiconductor package includes a first base integrated circuit (IC) die configured to provide, based at least in part on an indication of a configuration of a first plurality of compute dies 3D stacked on top of the first base IC die, a unique power domain to each of the first plurality of compute dies. In some embodiments, the semiconductor package also includes a second base IC die including a second plurality of compute dies 3D stacked on top of the second base IC die and an interconnect communicably coupling the first base IC die to the second base IC die.

17 Claims, 6 Drawing Sheets

(56) References Cited

U.S. PATENT DOCUMENTS

| | | | |
|---|---|---|---|
| 2021/0242170 A1* | 8/2021 | Dabral | H01L 23/50 |
| 2021/0247797 A1* | 8/2021 | Gu | G06F 9/5027 |
| 2021/0249296 A1* | 8/2021 | Or-Bach | H01L 23/544 |
| 2021/0375681 A1* | 12/2021 | Han | H01L 21/8232 |
| 2022/0077109 A1* | 3/2022 | Chava | H01L 24/80 |
| 2022/0100247 A1* | 3/2022 | Garg | G06F 1/3203 |
| 2022/0137692 A1* | 5/2022 | DiBene, II | G06F 1/3203 |
| | | | 713/320 |
| 2023/0103784 A1* | 4/2023 | Burton | H01L 24/16 |
| | | | 257/737 |

OTHER PUBLICATIONS

International Search Report and Written Opinion issued in Application No. PCT/US2022/036301, dated Oct. 28, 2022, 12 pages.
International Preliminary Report on Patentability issued in Application No. PCT/US2022/036301, mailed Jan. 18, 2024, 8 pages.

* cited by examiner

MULTI-DIE STACKED POWER DELIVERY

BACKGROUND

Multi-chip integration, in which two or more integrated circuits (ICs or "chips") are configured to interoperate with one another, includes various techniques such as using multi-chip modules, systems in a package, and three-dimensional chip stacking. Some conventional multi-chip modules include two or more semiconductor chips mounted side-by-side on a carrier substrate or in some cases on an interposer (in a so-called "2.5D" arrangement) that is, in-turn, mounted on a carrier substrate. Similarly, stacked semiconductor chip architectures include integrated circuits arranged in a stack with one or more interconnecting structures between chips, between chips and package, and between package and a printed circuit board.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

One technique that allows a packaged IC to include more circuit devices, and achieve more performance, is through the use of multi-chip module (MCM) technology. MCMs integrate a plurality of individual modules of circuit devices formed on a single IC die. The various MCM components are often integrated onto a unifying substrate so that the MCM operates as a single component. Multi-chip modules come in a variety of forms depending on complexity, such as using pre-packaged ICs on a printed circuit board (PCB) arranged to mimic the package footprint of an existing chip package. MCMs have the advantage of increasing yields of highly complex ICs by piecing a complex IC together with smaller IC components.

The manufacturing of a semiconductor chip involves many process steps, and with every step there are likely to be imperfections, process variability, alignment issues, and other factors that cause variations in device performance. For example, due to manufacturing process variances, each individual silicon die on a silicon wafer varies, relative to the other dies, in its individual performance characteristics given a same power source limitation. Due to each physical chip having different physical characteristics resulting from manufacturing, the physical chips will perform differently relative to each other as part of a multi-chip module even when provided the same voltage and when performing the same workload.

To address these problems and to enable improved system performance, FIGS. 1-6 describe systems and devices utilizing 3D die stacked chiplets that are independently monitorable and to which power is allocated independent of other chiplets. In various embodiments, a multi-die processor semiconductor package includes a first base integrated circuit (IC) die configured to provide, based at least in part on an indication of a configuration of a first plurality of compute dies 3D stacked on top of the first base IC die, a unique power domain to each of the first plurality of compute dies. The semiconductor package also includes a second base IC die including a second plurality of compute dies 3D stacked on top of the second base IC die and an interconnect communicably coupling the first base IC die to the second base IC die. In this manner, a power delivery topology is formed that dynamically reconfigures based on the type of compute die that is mounted on top of the base die. Because each die is individually controlled, the system is able to extract more performance out of a fixed power budget (such as by lowering voltage supplied to a compute die or package when it is idle or otherwise operating at a lower frequency, and allocating that power to a different system component).

Figure 1:
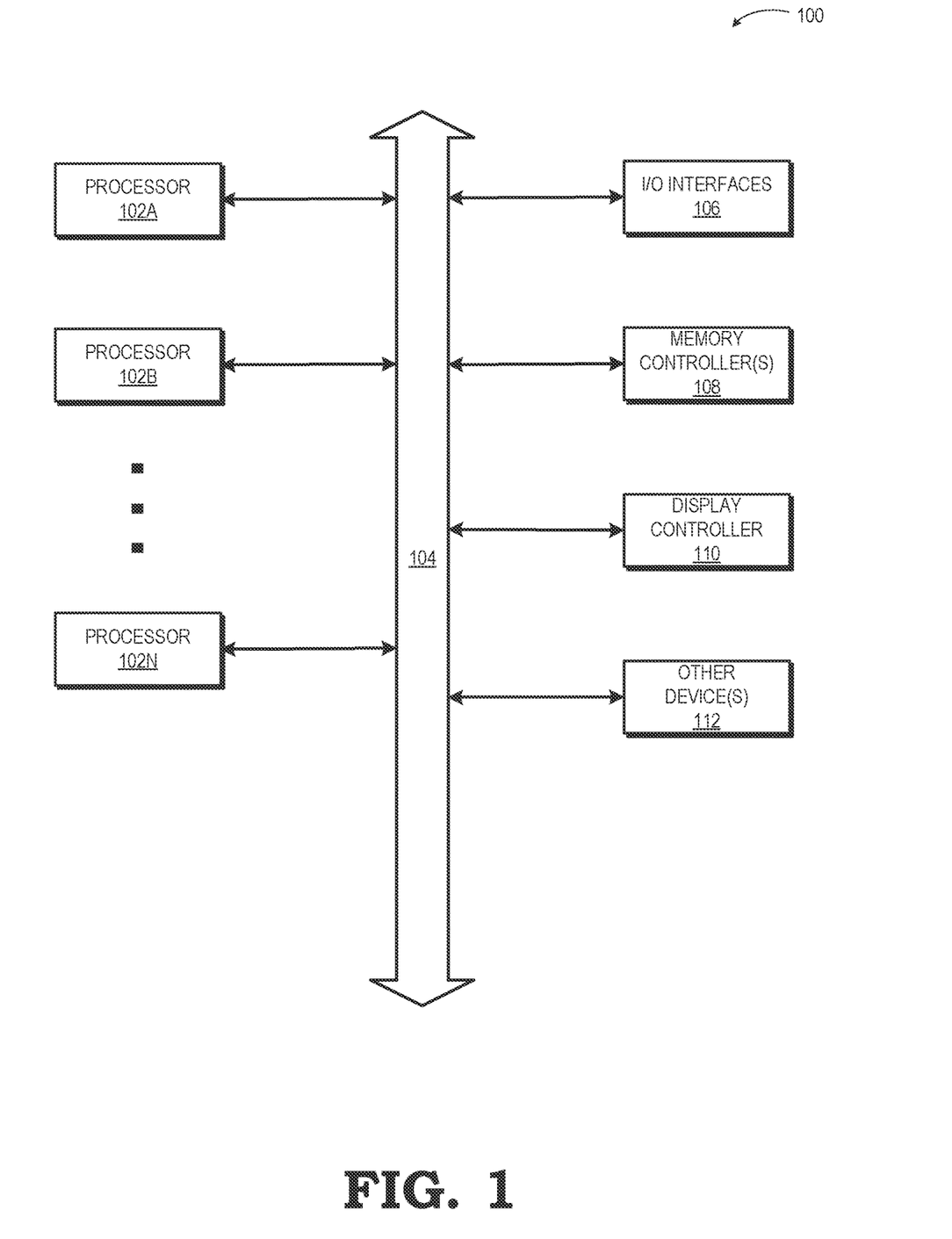
FIG. 1 is a block diagram of a computing system implementing multi-die processors in accordance with some embodiments.

FIG. 1 illustrates a block diagram of one embodiment of a computing system 100 implementing a multi-die processor in accordance with some embodiments. In various embodiments, computing system 100 includes at least one or more processors 102A-N, fabric 104, input/output (I/O) interfaces 106, memory controller(s) 108, display controller 110, and other device(s) 112. In various embodiments, to support execution of instructions for graphics and other types of workloads, the computing system 100 also includes a host processor 114, such as a central processing unit (CPU). In various embodiments, computing system 100 includes a computer, laptop, mobile device, server, or any of various other types of computing systems or devices. It is noted that the number of components of computing system 100 vary in some embodiments. It is also noted that in some embodiments computing system 100 includes other components not shown in FIG. 1. Additionally, in other embodiments, computing system 100 is structured in other ways than shown in FIG. 1.

Fabric 104 is representative of any communication interconnect that complies with any of various types of protocols utilized for communicating among the components of the computing system 100. Fabric 104 provides the data paths, switches, routers, and other logic that connect the processors 102, I/O interfaces 106, memory controller(s) 108, display controller 110, and other device(s) 112 to each other. Fabric 104 handles the request, response, and data traffic, as well as probe traffic to facilitate coherency. Fabric 104 also handles interrupt request routing and configuration access paths to the various components of computing system 100. Additionally, fabric 104 handles configuration requests, responses, and configuration data traffic. In some embodiments, fabric 104 is bus-based, including shared bus configurations, crossbar configurations, and hierarchical buses with bridges. In other embodiments, fabric 104 is packet-based, and hierarchical with bridges, crossbar, point-to-point, or other interconnects. From the point of view of fabric 104, the other components of computing system 100 are referred to as "clients". Fabric 104 is configured to process requests generated by various clients and pass the requests on to other clients.

Memory controller(s) 108 are representative of any number and type of memory controllers coupled to any number and type of memory device(s). For example, the type of memory device(s) coupled to memory controller(s) 108 include Dynamic Random Access Memory (DRAM), Static Random Access Memory (SRAM), NAND Flash memory, NOR flash memory, Ferroelectric Random Access Memory (FeRAM), or others. Memory controller(s) 108 are accessible by processors 102, I/O interfaces 106, display controller 110, and other device(s) 112 via fabric 104. I/O interfaces 106 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices are coupled to I/O interfaces 106. Such peripheral devices include (but are not limited to) displays, keyboards, mice, printers, scanners, joysticks or other types of game controllers, media recording devices, external storage devices, network interface cards, and so forth. Other device(s) 112 are representative of any number and type of devices (e.g., multimedia device, video codec).

In various embodiments, each of the processors 102 is a processor (e.g., central processing units (CPUs), vector processors, graphics processing units (GPUs), general-purpose GPUs (GPGPUs), non-scalar processors, highly-parallel processors, artificial intelligence (AI) processors, inference engines, machine learning processors, other multithreaded processing units, and the like). Each processor 102 is constructed as a multi-chip module (e.g., a semiconductor die package) including two or more base integrated circuit dies (described in more detail below with respect to FIG. 2) communicably coupled together with bridge chip(s) such that a processor is usable (e.g., addressable) like a single semiconductor integrated circuit. As used in this disclosure, the terms "die" and "chip" are interchangeably used. Those skilled in the art will recognize that a conventional (e.g., not multi-chip) semiconductor integrated circuit is manufactured as a wafer or as a die (e.g., single-chip IC) formed in a wafer and later separated from the wafer (e.g., when the wafer is diced); multiple ICs are often manufactured in a wafer simultaneously. The ICs and possibly discrete circuits and possibly other components (such as non-semiconductor packaging substrates including printed circuit boards, interposers, and possibly others) are assembled in a multi-die processor.

As described in more detail with respect to FIGS. 2-6 below, in various embodiments, each of the individual processors 102 include one or more base IC dies that dynamically reconfigure its power delivery topology based on the type of chiplet that is mounted on top of the base IC die. It should be recognized that although various embodiments are described below in the particular context of CPUs and GPUs for ease of illustration and description, the concepts described here is also similarly applicable to other processors including accelerated processing units (APUs), discrete GPUs (dGPUs), artificial intelligence (AI) accelerators, other parallel processors, and the like.

Figure 2:
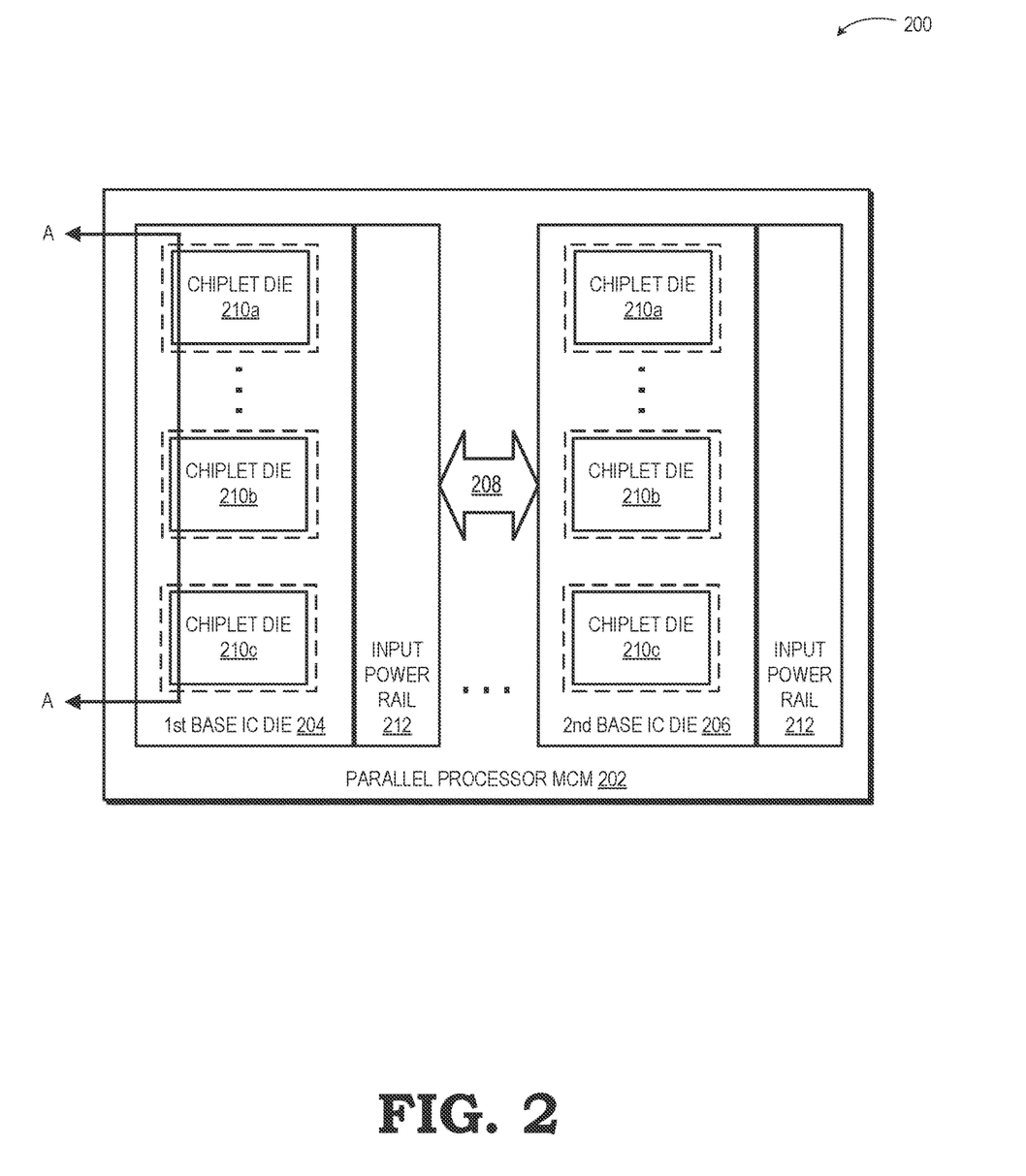
FIG. 2 is a block diagram illustrating a plan view of a multi-die processor in accordance with some embodiments.

Referring now to FIG. 2, illustrated is a block diagram illustrating a plan view 200 of a processor MCM 202 in accordance with some embodiments. The processor MCM 202 (e.g., processor 102 of FIG. 1) is formed as a single semiconductor chip package (e.g., a multi-die semiconductor package) including N number of base dies. As shown in plan view 200, the processor MCM 202 includes a first base IC die 204 and a second base IC die 206 (N=2 in the embodiment of FIG. 2). It should be appreciated that the base IC dies, in various embodiments, include one or more additional interconnect structures such as an inter-chip interconnect structure, a physical layer (PHY) interface, and the like for communicably coupling to other dies. For example, in some embodiments, a die-to-die interconnect 208 (such as ultra-short reach interconnects for interfacing between co-packaged dies within a multi-chip module) links multiple base dies (e.g., base IC dies 204,206) and integrates the base IC dies together to create a single logical base die. In this manner, high throughput interconnects link multiple base dies (e.g., base IC dies 204,206) with each other as modular components and, in some embodiments, use a cooperative command processor (not shown) for coordinating operations between the multiple dies to form a device having performance comparable to a larger monolithic device.

As shown in FIG. 2, the first base IC die 204 includes M number of chiplet dies 210 stacked on top of the first base IC die 204. In particular, the first base IC die 204 includes M=3 chiplet dies, including a first chiplet die 210a, a second chiplet die 210b, and a third chiplet die 210c. Similarly, the processor MCM 202 also includes M number of chiplet dies 210 stacked on top of the second base IC die 206. Although illustrated as including three chiplet dies 210, those skilled in the art will recognize that any number of chiplet dies may be positioned in the stacked die layer above the first base IC die 204 and the second base IC die 206.

In various embodiments, and as used herein, the term "chiplet" refers to any device including, but not limited to, the following characteristics: 1) a chiplet includes an active silicon die containing at least a portion of the computational logic used to solve a full problem (i.e., the computational workload is distributed across multiples of these active silicon dies); 2) chiplets are packaged together as a monolithic unit on the same substrate; and 3) the programming model preserves the concept that the combination of these separate computational dies (e.g., each chiplet 210 die stacked on top of the first base IC die 204 and the second base IC die 206) as a single monolithic unit (i.e., each chiplet is not exposed as a separate device to an application that uses the chiplets for processing computational workloads).

In the embodiment of FIG. 2, a chiplet die 210 includes, for example, a core compute die (CCD) containing two or more physical compute cores (not shown). In other embodiments, such as described below in more detail with respect to FIG. 4, a chiplet die 210 includes an accelerator core die containing two or more accelerator cores. Rather than just stacking compute cores on top of a common interposer, the base die is also split into two or more separate chips (e.g., the first base IC die 204 and the second base IC die 206). Additional details of the processor MCM architecture may be understood with reference to FIG. 3, which is a block diagram illustrating a sectional view of a multi-die processor in accordance with some embodiments. The view 300 provides a cross-sectional view of the power supply network topology of the first base IC die 204 and its stacked chiplet dies 210 of FIG. 2 taken at section A-A. In various embodiments, such as shown in FIG. 2, the base IC die 204 is identical to base IC die 206. In other embodiments, the base IC die 204 has a structure different than that of base IC die 206.

As described herein, in various embodiments, the processor MCM 202 includes a power supply topology in which a power supply, such as from an input power rail 212, dynamically reconfigures to give each chiplet die (e.g., chiplet die 210) its own power domain configuration depending on the type of chiplet die that is stacked on top of the base IC dies (e.g., first base IC die 204 and second base IC die 206). In this manner, the base IC dies support various configurations of chiplet dies (e.g., stacked chiplet dies 210 of FIG. 2). Accordingly, in various embodiments, the processor MCM 202 includes a reconfigurable voltage regulator network that supports the ability to be reconfigured based at least in part on which set of chiplet dies are stacked on top of the base IC die.

Figure 3:
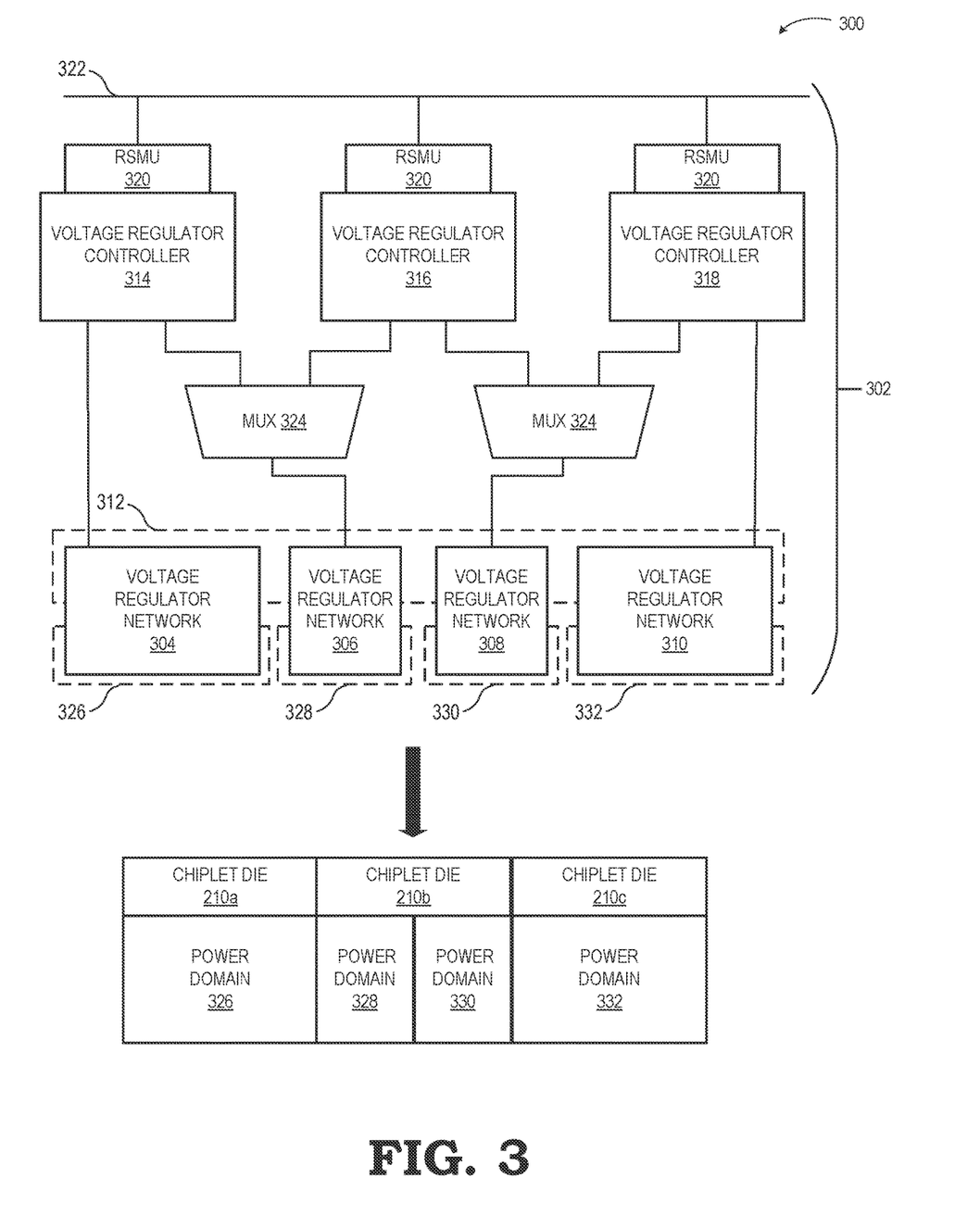
FIG. 3 is a block diagram illustrating a sectional view of a multi-die processor in accordance with some embodiments.

As shown in view 300, the voltage regulator network topology 302 includes four unique voltage regulator networks 304-310. Each stacked chiplet die 210 (e.g., the first chiplet die 210a, the second chiplet die 210b, and the third chiplet die 210c) is provided its own unique voltage that is generated by the voltage regulator networks 304-310 using the input power rail 312 (i.e., the input power rail 212 of FIG. 2). That is, input voltage from the input power rail 312 drives the input of the voltage regulator networks 304-310, with outputs of the voltage regulator network headers in within each unique voltage regulator network 304-310 being tied together to create a single power plane that is distributable up the stacked die (e.g., by using through silicon vias TSVs and the like) that pass through the base IC die 204 up to the stacked chiplet dies 210. In various embodiments, the voltage regulator networks 304-310 include, for example, digital low dropout (DLDO) voltage regulators for use in System on Chip (SoC) applications having multiple power domains and dynamic power supply ranges.

In some embodiments, the base IC dies instantiate a number of unique voltage regulator controllers that are logically connected to the voltage regulator networks. As shown, the voltage regulator network topology 302 includes at least a first voltage regulator controller 314, a second voltage regulator controller 316, and a third voltage regulator controller 318. In some embodiments, a remote system management unit (RSMU) 320 exposes the voltage regulator controllers to firmware via a system management network bus 322 or other configuration interface such that the voltage regulator controllers are configured accordingly by firmware.

Each of the first voltage regulator controller 314, the second voltage regulator controller 316, and the third voltage regulator controller 318 are configured, in various embodiments, to control one or more voltage regulator networks. In various embodiments, the voltage regulator controllers are configured based on which chiplet die is stacked on top of the base IC die. In the embodiment of FIGS. 2-3, the processor MCM 202 determines a power supply topology by sensing a hardware configuration of the stacked chiplet dies. For example, in some embodiments, the processor MCM 202 includes two or more multiplexers 324 that sense different hardware connections between stacked chiplets to the base IC die.

One or more present bits are positioned at the interface between the stacked chiplet dies and the base IC die. In one embodiment, if a chiplet die of a first type (i.e., the chiplet dies 210) is stacked or otherwise bonded to the base IC die, then the present bit returns a 0 and signals a hardware-based flagging of a determination of a type of chiplet present at the top layer. Based on this interface signal, the first base IC die 204 routes power domains and changes the mappings between voltage regulator controllers to voltage regulator networks. In particular, based on determining that the chiplet die of the first type is present, a first power domain 326 provides a first independent power plane to the first chiplet die 210a. A second power domain 328 and a third power domain 330 are unified to create a second independent power plane to the second chiplet die 210b. Additionally, a fourth power domain 332 provides a third independent power plane to the third chiplet die 210c. In this manner, from the chiplet die's perspective, the base IC die 204 provides each stacked chiplet die 210 its own unique power supply. In various embodiments, two or more voltage regulator networks are tied together at the chiplet to create a unified power plane. That is, the voltage regulator controllers 314-318 are rerouted to the above-described domains to create a single power domain for each chiplet die 210.

Figure 4:
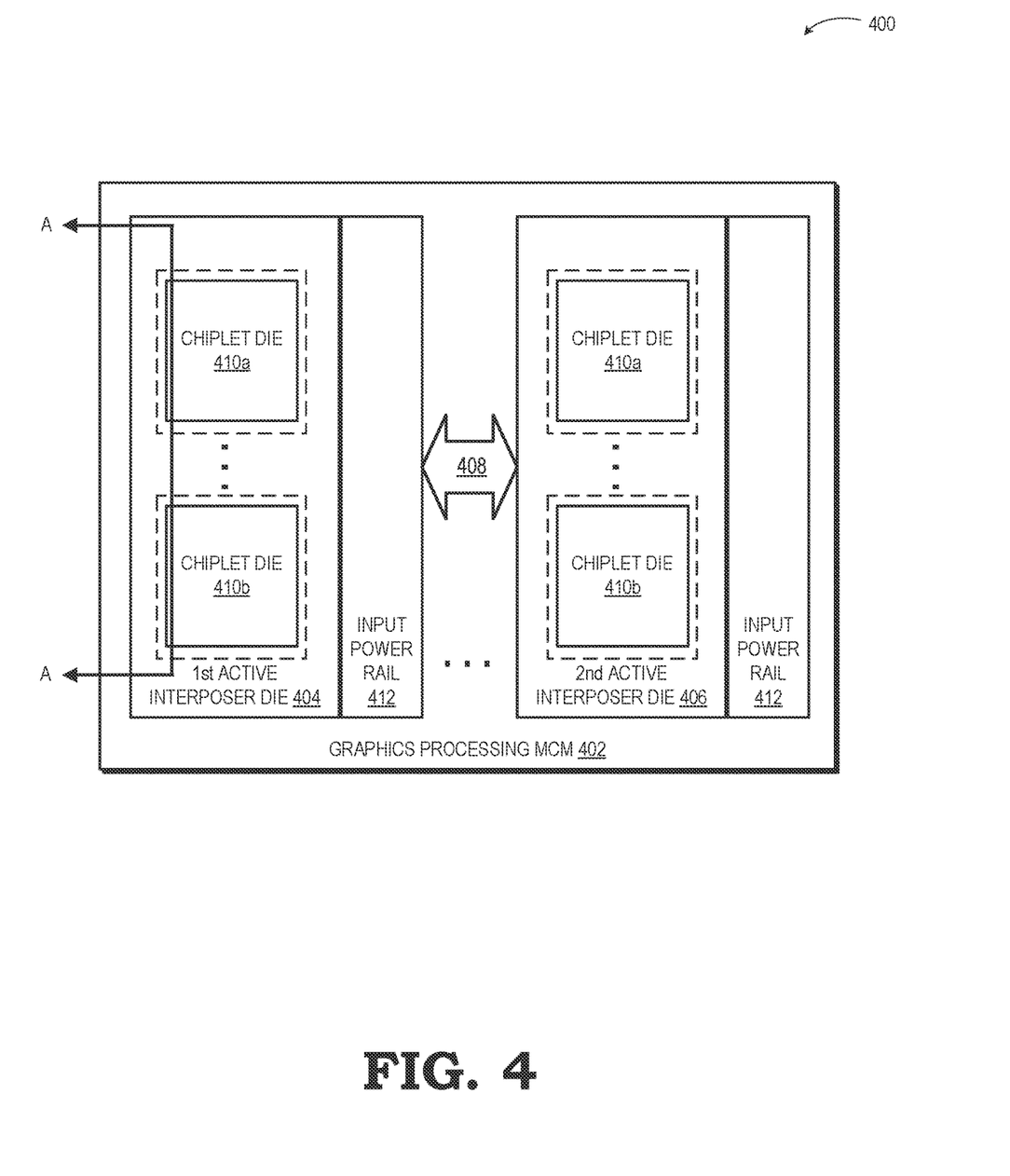
FIG. 4 is a block diagram of an example of a graphics processing multi-chip module in accordance with some embodiments.

Referring now to FIG. 4, illustrated is a block diagram illustrating a plan view 400 of a graphics processing MCM 402 in accordance with some embodiments. The graphics processing MCM 402 (e.g., processor 102 of FIG. 1) is formed as a single semiconductor chip package (e.g., a multi-die semiconductor package) including N number of base active interposer dies (similar to the base IC dies 204,206 of FIG. 2). It should be recognized that although the graphics processing MCM 402 is described below in the particular context of GPU terminology for ease of illustration and description, in various embodiments, the architecture described is applicable to any of a variety of types of processors (such as previously described more broadly with reference to FIGS. 2 and 3) without departing from the scope of this disclosure.

As shown in plan view 400, the graphics processing MCM 402 includes a first active interposer die 404 and a second active interposer die 406 (N=2 in the embodiment of FIG. 4). It should be appreciated that the base active interposer dies, in various embodiments, include one or more additional interconnect structures such as an inter-chip interconnect structure, a physical layer (PHY) interface, and the like for communicably coupling to other dies. For example, in some embodiments, a die-to-die interconnect 408 (such as ultra-short reach interconnects for interfacing between co-packaged dies within a multi-chip module) links multiple base dies (e.g., active interposer dies 404,406) and integrates the base active interposer dies together to create a single logical base die. In this manner, high throughput interconnects link multiple base dies (e.g., active interposer dies 404, 406) with each other as modular components and, in some embodiments, use a cooperative command processor (not shown) for coordinating operations between the multiple dies to form a device having performance comparable to a larger monolithic device.

As shown in FIG. 4, the first active interposer die 404 includes M number of chiplet dies 410 stacked on top of the first active interposer die 404. In particular, the first active interposer die 404 includes M=2 chiplet dies, including a first chiplet die 410a and a second chiplet die 410b. Similarly, the graphics processing MCM 402 also includes M number of chiplet dies 410 stacked on top of the second active interposer die 406. Although illustrated as including two chiplet dies 410, those skilled in the art will recognize that any number of chiplet dies may be positioned in the stacked die layer above the first active interposer die 404 and the second active interposer die 406.

In various embodiments, and as used herein, the term "chiplet" refers to any device including, but is not limited to, the following characteristics: 1) a chiplet includes an active silicon die containing at least a portion of the computational logic used to solve a full problem (i.e., the computational workload is distributed across multiples of these active silicon dies); 2) chiplets are packaged together as a monolithic unit on the same substrate; and 3) the programming model preserves the concept that the combination of these separate computational dies (e.g., each chiplet 410 die stacked on top of the first active interposer die 404 and the second active interposer die 406) as a single monolithic unit (i.e., each chiplet is not exposed as a separate device to an application that uses the chiplets for processing computational workloads).

In the embodiment of FIG. 4, a chiplet die 410 includes, for example, an accelerator core die containing two or more accelerator cores. In other embodiments, such as previously described below in more detail with respect to FIG. 2, a chiplet die 410 includes a core compute die (CCD) containing two or more physical compute cores (not shown). Rather than just stacking accelerator cores on top of a common interposer, the base die is also split into two or more separate chips (e.g., the first active interposer die 404 and the second active interposer die 406). Additional details of the graphics processing MCM architecture may be understood with reference to FIG. 5, which is a block diagram illustrating a sectional view of a multi-die graphics processor in accordance with some embodiments. The view 500 provides a cross-sectional view of the power supply network topology of the first active interposer die 404 and its stacked chiplet dies 410 of FIG. 4 taken at section A-A. In various embodiments, such as shown in FIG. 4, the active interposer die 404 is identical to active interposer die 406. In other embodiments, the active interposer die 404 has a structure different than that of active interposer die 406.

As described herein, in various embodiments, the graphics processing MCM 402 includes a power supply topology in which a power supply, such as from an input power rail 412, dynamically reconfigures to give each chiplet die (e.g., chiplet die 410) its own power domain configuration depending on the type of chiplet die that is stacked on top of the active interposer dies (e.g., first active interposer die 404 and second active interposer die 406). In this manner, the active interposer dies support various configurations of chiplet dies (e.g., stacked chiplet dies 410 of FIG. 4). Accordingly, in various embodiments, the graphics processing MCM 402 includes a reconfigurable voltage regulator network that supports the ability to be reconfigured based at least in part on which set of chiplet dies are stacked on top of the active interposer die.

Figure 5:
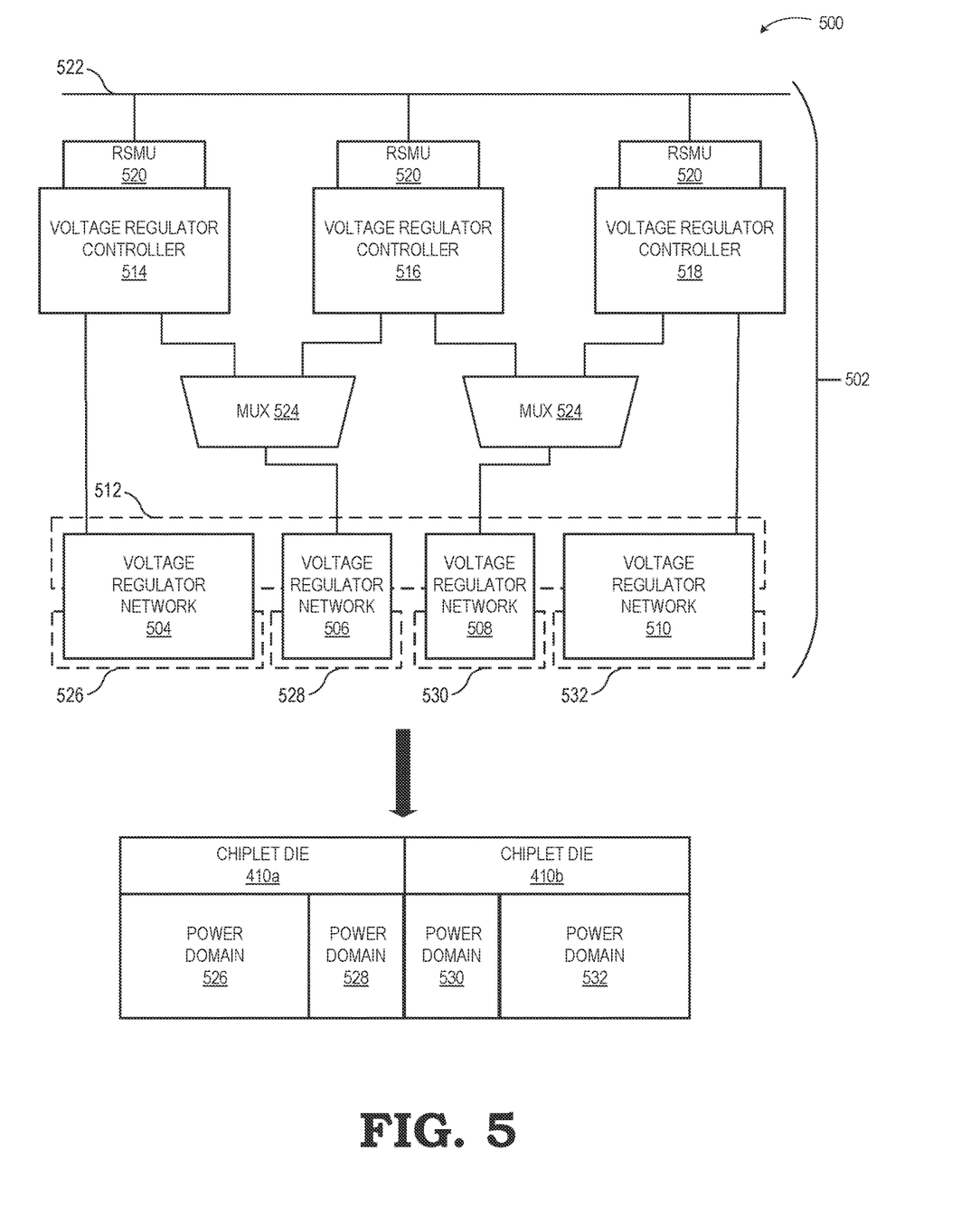
FIG. 5 is a block diagram illustrating a sectional view of a graphics processing multi-chip module in accordance with some embodiments.

As shown in view 500, the voltage regulator network topology 502 includes four unique voltage regulator networks 504-510. Each stacked chiplet die 410 (e.g., the first chiplet die 410a and the second chiplet die 410b) is provided its own unique voltage that is generated by the voltage regulator networks 504-510 using the input power rail 512 (i.e., the input power rail 412 of FIG. 4). That is, input voltage from the input power rail 512 drives the input of the voltage regulator networks 504-510, with outputs of the voltage regulator network headers in within each unique voltage regulator network 504-510 being tied together to create a single power plane that is distributable up the stacked die (e.g., by using through silicon vias TSVs and the like) that pass through the active interposer die 404 up to the stacked chiplet dies 410. In various embodiments, the voltage regulator networks 504-510 include, for example, digital low dropout (DLDO) voltage regulators for use in System on Chip (SoC) applications having multiple power domains and dynamic power supply ranges.

In some embodiments, the active interposer dies instantiate a number of unique voltage regulator controllers that are logically connected to the voltage regulator networks. As shown, the voltage regulator network topology 502 includes at least a first voltage regulator controller 514, a second voltage regulator controller 516, and a third voltage regulator controller 518. In some embodiments, a remote system management unit (RSMU) 520 exposes the voltage regulator controllers to firmware via a system management network bus 522 or other configuration interface such that the voltage regulator controllers are configured accordingly by firmware.

Each of the first voltage regulator controller 514, the second voltage regulator controller 516, and the third voltage regulator controller 518 are configured, in various embodiments, to control one or more voltage regulator networks. In various embodiments, the voltage regulator controllers are configured based on which chiplet die is stacked on top of the active interposer die. In the embodiment of FIGS. 4-5, the graphics processing MCM 402 determines a power supply topology by sensing a hardware configuration of the stacked chiplet dies. For example, in some embodiments, the graphics processing MCM 402 includes two or more multiplexers 524 that sense different hardware connections between stacked chiplets to the active interposer die.

One or more present bits are positioned at the interface between the stacked chiplet dies and the active interposer die. In one embodiment, if a chiplet die of a second type (i.e., the chiplet dies 410 as opposed to the chiplet dies 210 of FIG. 2) is stacked or otherwise bonded to the active interposer die, then the present bit returns a 1 and signals a hardware-based flagging of a determination of the second type of chiplet present at the top layer. Based on this interface signal, the first active interposer die 404 routes power domains and changes the mappings between voltage regulator controllers to voltage regulator networks. In particular, based on determining that the chiplet die of the second type is present, a first power domain 526 and a second power domain 528 are unified to provide a first independent power plane to the first chiplet die 410a. Additionally, a third power domain 530 and a fourth power domain 532 are unified to provide a second independent power plane to the second chiplet die 410b. In this manner, from the chiplet die's perspective, the active interposer die 404 provides each stacked chiplet die 410 its own unique power supply. That is, the voltage regulator controllers 514-518 are rerouted to the above-described domains to create a single power domain for each chiplet die 410.

Figure 6:
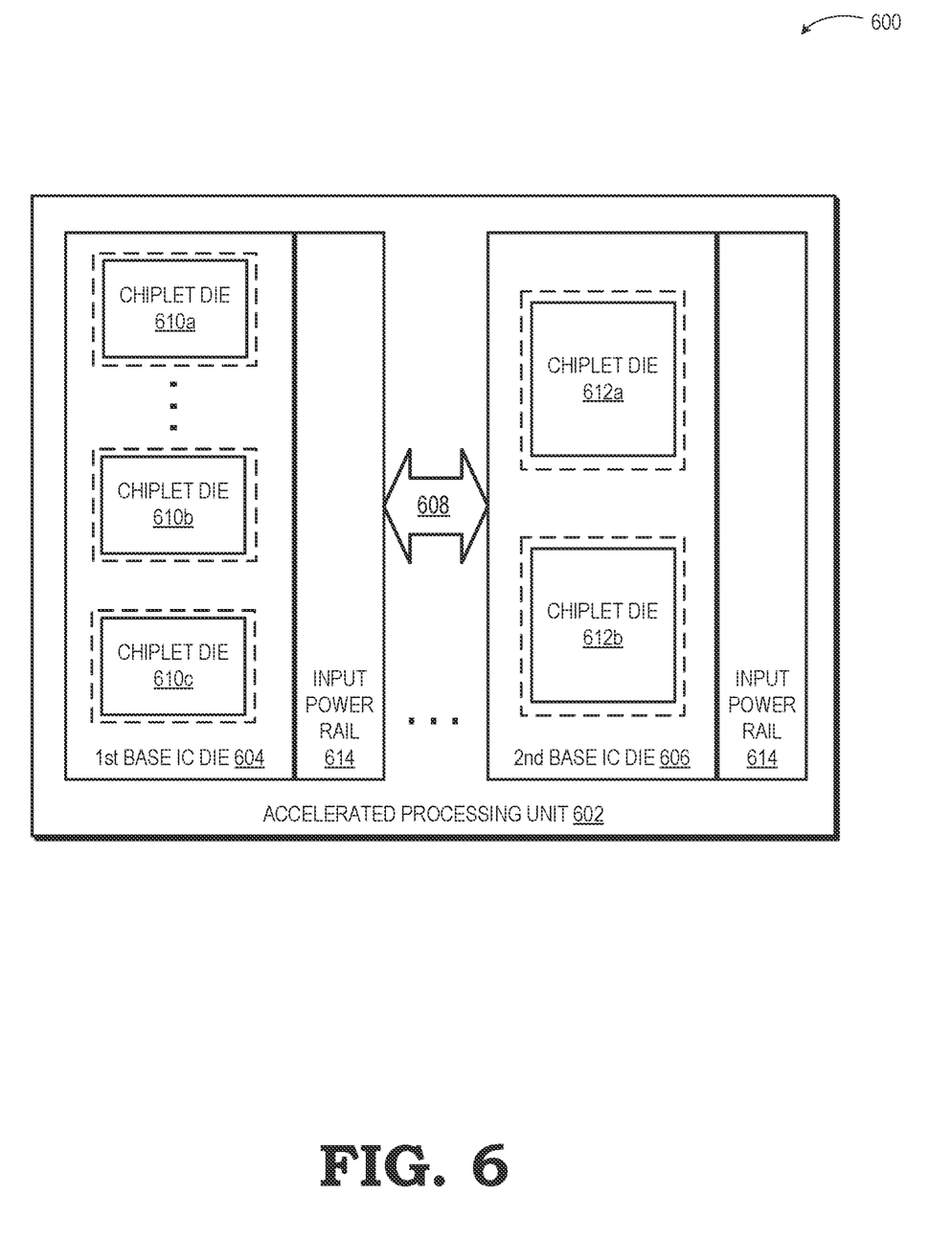
FIG. 6 is a block diagram illustrating a plan view of an accelerated processing unit in accordance with some embodiments in accordance with some embodiments.

Although described above in the context of base IC dies having the same structure within a package (e.g., base IC dies 204, 206 of processor MCM 202 and active interposer dies 404,406 of graphics processing MCM 402), those skilled in the art will recognize that each base die and/or AID supports the stacking of any different number or combination of chiplet dies to create different SoC configurations. Referring now to FIG. 6, illustrated is a block diagram illustrating a plan view 600 of an accelerated processing unit (APU) 602 in accordance with some embodiments.

The accelerated processing unit 602 (e.g., processor 102 of FIG. 1) is formed as a single semiconductor chip package (e.g., a multi-die semiconductor package) including N number of base dies. As shown in plan view 600, the accelerated processing unit 602 includes a first base IC die 604 and a second base IC die 606 (N=2 in the embodiment of FIG. 2). It should be appreciated that the base IC dies, in various embodiments, include one or more additional interconnect structures such as an inter-chip interconnect structure, a physical layer (PHY) interface, and the like for communicably coupling to other dies. For example, in some embodiments, a die-to-die interconnect 608 (such as ultra-short reach interconnects for interfacing between co-packaged dies within a multi-chip module) links multiple base dies (e.g., base IC dies 604,606) and integrates the base IC dies together to create a single logical base die. In this manner, high throughput interconnects link multiple base dies (e.g., base IC dies 604,606) with each other as modular components and, in some embodiments, use a cooperative command processor (not shown) for coordinating operations between the multiple dies to form a device having performance comparable to a larger monolithic device.

As shown in FIG. 6, the first base IC die 604 includes M number of chiplet dies 610 stacked on top of the first base IC die 604. In particular, the first base IC die 604 includes M=3 chiplet dies, including a first chiplet die 610*a*, a second chiplet die 610*b*, and a third chiplet die 610*c*. Although illustrated as including three chiplet dies 610, those skilled in the art will recognize that any number of chiplet dies may be positioned in the stacked die layer above the first base IC die 604. In the embodiment of FIG. 6, a chiplet die 610 includes, for example, a core compute die (CCD) containing two or more physical compute cores (not shown). However, those skilled in the art will recognize that the specific examples of compute dies are provided herein for example purposes only, and in various embodiments, the architecture described is applicable to any of a variety of types of processors and compute without departing from the scope of this disclosure.

The second base IC die 606 includes J number of chiplet dies 612 of a different type than chiplet dies 610 stacked on top of the second base IC die 606. In particular, the second base IC die 606 includes J=2 chiplet dies, including a first chiplet die 612*a* and a second chiplet die 612*b*. Although illustrated as including two chiplet dies 612, those skilled in the art will recognize that any number of chiplet dies may be positioned in the stacked die layer above the second base IC die 606. In the embodiment of FIG. 6, a chiplet die 612 includes, for example, an accelerator core die containing two or more accelerator cores. However, those skilled in the art will recognize that the specific examples of core dies are provided herein for example purposes only, and in various embodiments, the architecture described is applicable to any of a variety of types of processors and compute without departing from the scope of this disclosure.

As previously described in more detail with respect to FIGS. 2-5, in various embodiments, the accelerated processing unit 602 includes a power supply topology in which a power supply, such as from an input power rail 614, dynamically reconfigures to give each chiplet die (e.g., chiplet dies 610,612) its own power domain configuration depending on the type of chiplet die that is stacked on top of the base IC dies (e.g., first base IC die 604 and second base IC die 606). In this manner, the base IC dies support various configurations of chiplet dies (e.g., APU with a combination of CPU and accelerator cores). In various embodiments, the accelerated processing unit 602 includes a reconfigurable voltage regulator network that supports the ability to be reconfigured based at least in part on which set of chiplet dies are stacked on top of the base IC die.

Accordingly, as described herein, each stacked chiplet die (e.g., dies 210, 410, and 610) is operated independently of each other with their unique power domains while only providing the base IC dies with a single power supply. When each chiplet die is individually monitorable and controllable, the overall system is able to output more performance out of a fixed power budget (as power conserved somewhere is power available for use by another component). The system independently monitors chiplet dies and dynamically change voltage regulator topology to match the topology of the stacked chiplet dies. In this manner, power routing is independent of the design of the underlying platform board and does not require supplying voltages separately using dedicated power routes or handling power routing from outside the package.

A computer readable storage medium includes any non-transitory storage medium, or combination of non-transitory storage media, accessible by a computer system during use to provide instructions and/or data to the computer system. Such storage media include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium is embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above are implemented by one or more processors of a processing system executing software. The software includes one or more sets of executable instructions stored or otherwise tangibly embodied on a non-transitory computer readable storage medium. The software include the instructions and certain data that, when executed by the one or more processors, manipulate the one or more processors to perform one or more aspects of the techniques described above. The non-transitory computer readable storage medium include, for example, a magnetic or optical disk storage device, solid state storage devices such as Flash memory, a cache, random access memory (RAM) or other non-volatile memory device or devices, and the like. The executable instructions stored on the non-transitory computer readable storage medium include source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A processor, comprising:
   a first base integrated circuit (IC) die configured to provide, based at least in part on an indication of a configuration of a first plurality of compute dies stacked on top of the first base IC die, a different power domain to each of the first plurality of compute dies, each of the different power domains corresponding to a different power plane,
   wherein the first base IC die is configured to unify power domains of two or more voltage regulator networks of a plurality of voltage regulator networks to provide a first independent power plane to a first compute die of the first plurality of compute dies.

2. The processor of claim 1, further comprising:
   one or more present bits positioned at an interface between the first base IC die and the first plurality of compute dies, wherein the one or more present bits indicate a first value for a first hardware configuration including the first plurality of compute dies stacked on top of the first base IC die.

3. The processor of claim 1, wherein the first base IC die includes the plurality of voltage regulator networks for providing power to the different power domain of each of the first plurality of compute dies.

4. The processor of claim 3, wherein a first voltage regulator provides a second independent power domain to a second compute die of the first plurality of compute dies.

5. The processor of claim 3, further comprising:
   a plurality of voltage regulator controllers, wherein each of the plurality of voltage regulator controllers is configured to control, based at least in part on the indication of the configuration of the first plurality of compute dies, one or more of the plurality of voltage regulator networks.

6. The processor of claim 3, further comprising:
   an input power rail providing a single power supply to the plurality of voltage regulator networks of the first base IC die.

7. A system, comprising:
   a processor multi-chip module communicably coupled to a host processor, wherein the processor multi-chip module includes:
      a first base integrated circuit (IC) die configured to provide, based at least in part on an indication of a configuration of a first plurality of compute dies 3D stacked on top of the first base IC die, a different power domain to each of the first plurality of compute dies, each of the different power domains corresponding to a different power plane,
      wherein the first base IC dies is configured to unify power domains of two or more voltage regulator networks of a plurality of voltage regulator networks to provide a first independent power plane to a first compute die of the first plurality of compute dies.

8. The system of claim 7, wherein the indication of the configuration signals a type of compute die of the first plurality of compute dies 3D stacked on top of the first base IC die, wherein a first compute die of the first plurality of compute dies includes a different hardware configuration relative to the configuration of a second compute die of the first plurality of compute dies, wherein, based on the type of compute die of the first plurality of compute dies 3D stacked on top of the first base IC die, the first base IC die provides a first power domain providing a first independent power plane to the first compute die and a second power domain providing a second independent power plane to the second compute die.

9. The system of claim 7, further comprising:
   one or more present bits positioned at an interface between the first base IC die and the first plurality of compute dies, wherein the one or more present bits indicate a first value for a first hardware configuration including the first plurality of compute dies 3D stacked on top of the first base IC die.

10. The system of claim 7, wherein the first base IC die includes the plurality of voltage regulator networks for providing power to the different power domain of each of the first plurality of compute dies.

11. The system of claim 10, wherein a first voltage regulator provides a second independent power domain to a second compute die of the first plurality of compute dies.

12. The system of claim 10, further comprising:
   a plurality of voltage regulator controllers, wherein each of the plurality of voltage regulator controllers is configured to control, based at least in part on the indication of the configuration of the first plurality of compute dies, one or more of the plurality of voltage regulator networks.

13. An integrated circuit device, comprising:
   a first base integrated circuit (IC) die configured to provide, based at least in part on an indication of a configuration of a first plurality of compute dies 3D stacked on top of the first base IC die, a unique power domain to each of the first plurality of compute dies, each unique power domain corresponding to a different power plane,
   wherein the first base IC die is configured to unify power domains of two or more voltage regulator networks of a plurality of voltage regulator networks to provide a first independent power plane to a first compute die of the first plurality of compute dies.

14. The integrated circuit device of claim 13, wherein the first base IC die includes the plurality of voltage regulator networks for providing power to the unique power domain of each of the first plurality of compute dies.

15. The integrated circuit device of claim 14, wherein a first voltage regulator provides a second independent power domain to a second compute die of the first plurality of compute dies.

16. The integrated circuit device of claim 15, further comprising:
   a plurality of voltage regulator controllers, wherein each of the plurality of voltage regulator controllers is configured to control, based at least in part on the indication of the configuration of the first plurality of compute dies, one or more of the voltage regulator networks.

17. The integrated circuit device of claim 15, further comprising:
   an input power rail providing a single power supply to the plurality of voltage regulator networks of the first base IC die.

* * * * *